US011169203B1

(12) United States Patent
Kramer (10) Patent No.: US 11,169,203 B1
(45) Date of Patent: Nov. 9, 2021

(54) DETERMINING A CONFIGURATION OF A TEST SYSTEM

(71) Applicant: Teradyne, Inc., North Reading, MA (US)

(72) Inventor: Randall T. Kramer, East Sandwich, MA (US)

(73) Assignee: TERADYNE, INC., North Reading, MA (US)

(*) Notice: Subject to any disclaimer, the term of this patent is extended or adjusted under 35 U.S.C. 154(b) by 133 days.

(21) Appl. No.: 16/142,958

(22) Filed: Sep. 26, 2018

(51) Int. Cl.
*G01R 31/28* (2006.01)
*G06Q 10/06* (2012.01)

(52) U.S. Cl.
CPC ... *G01R 31/2834* (2013.01); *G06Q 10/06315* (2013.01)

(58) Field of Classification Search
CPC .............. G01R 31/2834; G06Q 10/06315
See application file for complete search history.

(56) References Cited

U.S. PATENT DOCUMENTS

| | | |
|---|---|---|
| 5,578,930 A | 11/1996 | Sheen |
| 5,604,751 A | 2/1997 | Panis |
| 5,699,402 A | 12/1997 | Bauer et al. |
| 5,828,674 A | 10/1998 | Proskauer |
| 5,870,451 A | 2/1999 | Winkler et al. |
| 5,910,895 A | 6/1999 | Proskauer et al. |
| 5,938,781 A | 8/1999 | Proskauer |
| 6,047,293 A | 4/2000 | Blitz |
| 6,507,920 B1 | 1/2003 | Truebenbach |
| 6,717,432 B2 | 4/2004 | Chiu et al. |
| 7,046,027 B2 | 5/2006 | Conner |
| 7,080,304 B2 | 7/2006 | Reese |
| 7,085,668 B2 | 8/2006 | Johnson |
| 7,171,587 B2 | 1/2007 | Hlotyak et al. |
| 7,343,387 B2 | 3/2008 | Reese |
| 7,908,531 B2 | 3/2011 | Fairbanks et al. |
| 8,131,387 B2 | 3/2012 | Zhang |
| 8,762,095 B2 | 6/2014 | Van Wagenen et al. |
| 9,134,377 B2 | 9/2015 | Champion et al. |
| 9,165,735 B2 | 10/2015 | Sanders, III et al. |
| 9,244,126 B2 | 1/2016 | Sartschev et al. |
| 9,279,857 B2 | 3/2016 | Lin et al. |
| 9,470,759 B2 | 10/2016 | Bourassa et al. |
| 9,484,116 B1 * | 11/2016 | Kosugi ............ G01R 31/31935 |
| 9,514,037 B1 * | 12/2016 | Dow ................ G06Q 10/06315 |
| 9,638,742 B2 | 5/2017 | Suto |
| 9,755,766 B2 | 9/2017 | Wadell et al. |

(Continued)

*Primary Examiner* — Tung X Nguyen
*Assistant Examiner* — Feba Pothen
(74) *Attorney, Agent, or Firm* — Burns & Levinson LLP (57) ABSTRACT

Example systems for determining a configuration of a test system execute operations that include receiving first parameters specifying at least part of an operation of a test system; receiving second parameters specifying at least part of a first configuration of the test system; determining a second configuration of the test system based, at least in part, on the first parameters and the second parameters, with the second configuration being determined to impact a cost of test of the test system; generating, by one or more processing devices, data for a graphical user interface representing information about the second configuration and the cost of test; and outputting the data for the graphical user interface for rendering on a display device.

38 Claims, 8 Drawing Sheets

(56) References Cited

U.S. PATENT DOCUMENTS

| | | | |
|---|---|---|---|
| 10,048,304 B2 | 8/2018 | King et al. | |
| 10,139,449 B2 | 11/2018 | Caradonna et al. | |
| 2005/0153465 A1* | 7/2005 | Wada | G11C 29/56 438/14 |
| 2010/0082284 A1* | 4/2010 | Adachi | G01R 31/2834 702/120 |

* cited by examiner

| | | | |
|---|---|---|---|
| OVERALL TEST TIME PARAMETERS | SINGLE SITE TEST TIME | 10.000 | SECONDS |
| | TOTAL SITES | 8 | # |
| | TOTAL MULTI-SITE TEST TIME | | SECONDS |
| | OVERALL PTE | 95.00% | % |
| WITHIN A TEST CONTROLLER (OR SECTOR) | SITES ON A TEST CONTROLLER (WITHIN A SECTOR) | | # |
| | MSTT ON A TEST CONTROLLER (WITHIN A SECTOR) | | SECONDS |
| | PTE ON A TEST CONTROLLER (WITHIN A SECTOR) | | % |
| ACROSS TEST CONTROLLERS (OR SECTORS) | NUMBER OF TEST CONTROLLERS | 4 | # |
| | PTE ACROSS TEST CONTROLLERS | 99.90% | % |

ENTER → RECEIVE KNOWN TEST TIME PARAMETERS (42)

DETERMINING A CONFIGURATION OF A TEST SYSTEM

TECHNICAL FIELD

This specification relates generally to determining a configuration of a test system.

BACKGROUND

Test systems are configured to test the operation of electronic devices, such as microprocessors and memory chips. Testing may include sending signals to a device and determining how the device reacted to those signals based on its response. The device's reaction will dictate whether the device has passed or failed testing.

Test systems may be configurable. Different configurations may have different costs of test (COT). In some cases, a COT includes monetary expenses associated with testing a type of device, a device from a manufacturer, or a group of such devices. The cost of testing a device may be influenced by the number of test sites for implementing parallel testing. Several parameters about the device and the test system may be required to determine an optimal tester configuration including the number of test sites for a specific tester.

SUMMARY

Example techniques for determining a configuration of a test system include receiving first parameters specifying at least part of an operation of a test system; receiving second parameters specifying at least part of a first configuration of the test system; and determining a second configuration of the test system based, at least in part, on the first parameters and the second parameters. The second configuration is determined to impact a cost of test of the test system. The example techniques also include generating, by one or more processing devices, data for a graphical user interface representing information about the second configuration and the cost of test; and outputting the data for the graphical user interface for rendering on a display device. The example techniques may include one or more of the following features, either alone or in combination.

The example techniques may include configuring the test system automatically based on the second configuration. Configuring the test system may include controlling assembly of hardware components of the test system. Controlling assembly may include controlling robotics to assemble the test system using the hardware components. Configuring the test system may include specifying a number of test slots and a number of test boards to incorporate into the test system to perform testing. Configuring the test system may include specifying a number of controllers to include in the test system.

The first parameters may include one of more of the following: single test time, parallel test site efficiency, test controller efficiency, a number of controllers in the first configuration, or multi-test time. The second parameters may include one or more of the following: types of test head slots, test instrument assignments for test head slot types, test controllers per test instrument, or test system component costs.

The test system may be for testing a device. The example techniques may include receiving third parameters based on the device to be tested. The second configuration may be determined based also on the third parameters. The first parameters may include a test time. The second parameters may include at least one of a number of test slots, a number of test boards, or a number of controllers. The cost of test may include a minimized cost of test corresponding to the second configuration. The second configuration may be determined to minimize a cost of test of the test system. The data for the graphical user interface may also represent information about one or more other configurations of the test system.

At least part of the first configuration may be based on operational parameters of one or more test instruments in the test system that are used to test one or more devices. The second configuration may be determined to optimize a cost of test of the test system. The example techniques may include determining an initial cost of test for the first configuration. An optimized cost of test is less than the initial cost of test. The optimized cost of test may be different from a minimized cost of test of the test system.

The example techniques may include determining third parameters based on the second parameters, with the third parameters specifying at least part of the second configuration. The second configuration may be determined also based on the third parameters. The third parameters may include information about the test system unknown from the second parameters.

The example techniques may include determining third parameters based on the first parameters, with the third parameters specifying at least part of the operation of the test system. The second configuration may be determined also based on the third parameters. The third parameters may include information about the test system unknown from the first parameters.

Any two or more of the features described in this specification, including in this summary section, can be combined to form implementations not specifically described herein.

The techniques, systems, and processes described herein, or portions thereof, can be implemented as or controlled by a computer program product that includes instructions that are stored on one or more non-transitory machine-readable storage media, and that are executable on one or more processing devices to implement or to control (e.g., to coordinate) the operations described herein. The techniques, systems, and processes described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DETAILED DESCRIPTION

Described herein are example implementations of processes for determining a configuration of a test system, such as automatic test equipment (ATE). In an example, the processes are for determining an optimal configuration of a test system on a production floor to reduce the overall cost of testing a semiconductor device.

An example process may be performed on a computing system comprised of one or more processing devices, such as microprocessors. Operations performed by the process may include rendering a graphical user interface (GUI) on the display device of a computing system. The GUI is configured to receive parameters relating to the configuration of the test system, and to present information, such as numbers and graphics, relating to a test system having an improved or optimal cost of test (COT). An optimal cost of test may be, but is not limited to, a minimum cost of test. As noted, in some cases, a COT includes the monetary expenses associated with testing a type of device, a device from a manufacturer, or a group of such devices.

An example implementation of the process includes receiving first parameters specifying at least part of an operation of a test system. For example, the first parameters may include the time allocated to perform testing or "test time". The example process may include receiving second parameters specifying at least part of a first configuration of the test system. The first configuration may be a current configuration of the test system having a COT that has not been optimized. The second parameters may include, for example, the number of test instruments or test controllers included in the current configuration of the test system.

The process may include determining a second configuration of the test system based, at least in part, on the first parameters and the second parameters. The second configuration may be determined to impact—for example, to reduce or to optimize—a COT of the test system for one or more devices under test (DUT). For example, the process may generate a second configuration of the test system that will have a minimum COT to test one or more DUTs based on constraints, such as available hardware. Information about the second configuration may be presented on the GUI.

For example, the information may represent the second configuration numerically, graphically, or both numerically and graphically. The information may also include the COT of the second configuration, along with COTs of one or more other configurations. The GUI may be rendered on a display locally or remotely.

The information may be used to configure the test system automatically. For example, the test system may be configured so that the test system is in the second configuration. Configuring the test system may include controlling assembly of hardware components of the test system. In some implementations, robotics may be used to configure the test system. In an example, one or more robots may be configured to connect, or to disconnect, hardware components from the test system to produce the second configuration. In an example, one or more robots may be configured to assemble the test system in the second configuration using hardware components. In some implementations, a computing system controls connecting, or disconnecting, hardware components from the test system to produce the second configuration. For example, the computing system may be configured—for example, programmed—to control switches or other electrical, mechanical, or electromechanical devices to configure the test system into the second configuration. For example, as part of the configuration process, the computing system may be configured to close some switches to connect some test instruments to the test system and to open other switches to disconnect some test instruments from the test system.

In some implementations, configuration of the test system may be controlled by a test engineer directing the robots via the computing system or specifying, on the computing system, control over switches or other electrical, mechanical, or electromechanical devices to configure the test system into the second configuration. In some implementations, the computing system may be programmed to direct the robots or to control the switches or other electrical, mechanical, or electromechanical devices automatically. For example, operations for directing the robots or controlling the switches or other electrical, mechanical, or electromechanical devices may be initiated independent of input on the computing system from the test engineer.

Figure 1:
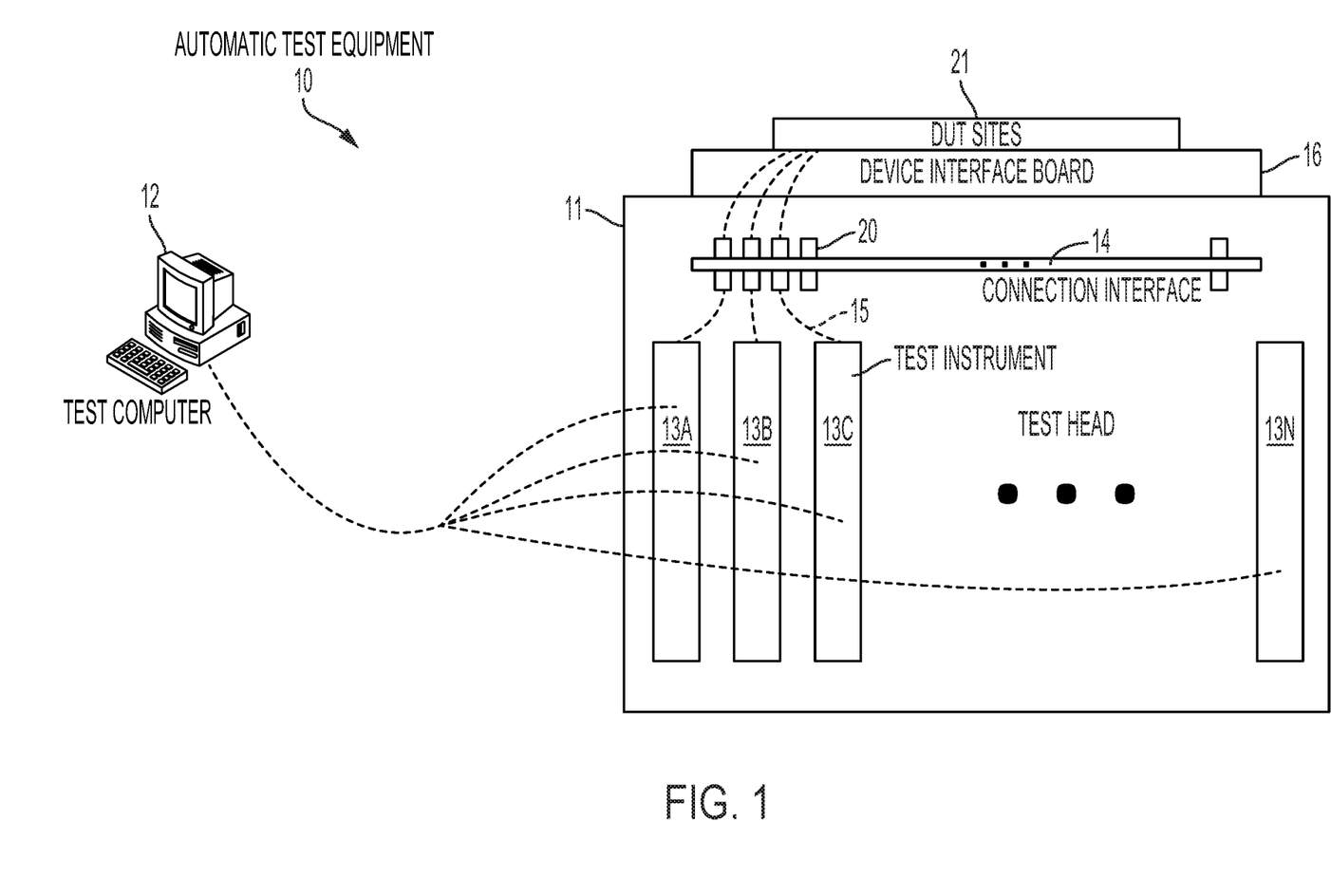
FIG. 1 is a block diagram of components of an example test system.

FIG. 1 shows components of example ATE 10. Notably, however, the systems and processes described in this specification are not limited to use with the ATE of FIG. 1 or to use with any particular type of DUT, but rather may be used in any appropriate technical context. In FIG. 1, the dashed lines represent, conceptually, potential signal paths between instruments.

ATE 10 includes a test head 11 and a test computer 12. Test head 11 interfaces to DUTs (not shown) on which tests are to be performed. Test computer 12 communicates with test head 11 to control testing. For example, test computer may download test program sets to test instruments on the test head, which then run the test program sets to test DUTs in communication with the test head.

ATE 10 includes test instruments 13A to 13N (where "N" indicates more than three test instruments). In this example, the test instruments are housed in the test head. Each test instrument may be housed in a separate slot in the test head. In some implementations, the test instruments are modular. For example, one test instrument may be replaced with a different test instrument that performs a different function or the same function, without replacing other test instruments. Each test instrument may be configured to output test signals to test a DUT, and to receive signals from the DUT.

The signals may be digital, analog, wireless, or wired, for example. The signals received may include response signals that are based on the test signals, signals that originate from the DUT that are not prompted by (e.g., are not in response to) test signals, or both types of these signals.

ATE 10 includes a connection interface 14, which connects test instrument outputs 15 to DIB 16. Connection interface 14 may include connectors 20 or other devices for routing signals between the test instruments and DIB 16. For example, the connection interface may include one or more circuit boards or other substrates on which such connectors are mounted. Other types of connections may be used.

In the example of FIG. 1, DIB 16 connects, electrically and mechanically, to test head 11. DIB 16 includes test sites 21, which may include pins, traces, or other points of electrical and mechanical connection to which DUTs connect. Test signals, response signals, and other signals pass over the test sites between the DUT and test instruments. DIB 16 also may include, for example, connectors, conductive traces, circuitry, or some combination thereof for routing signals between the test instruments and the DUTs.

Figure 2:
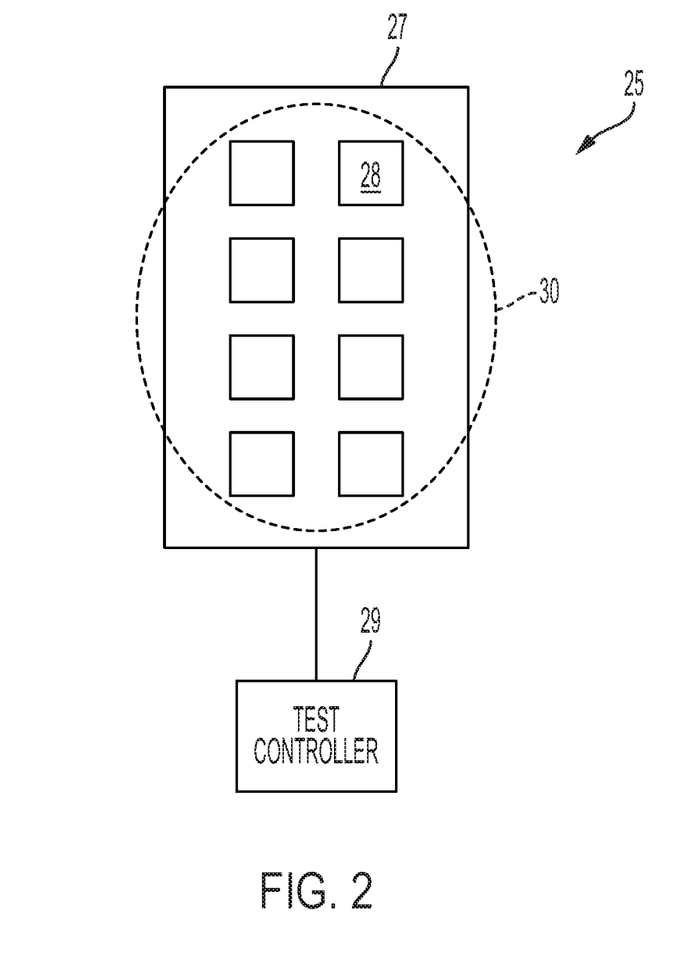
FIG. 2 is a block diagram of single test controller architecture for the test system.
Figure 3:
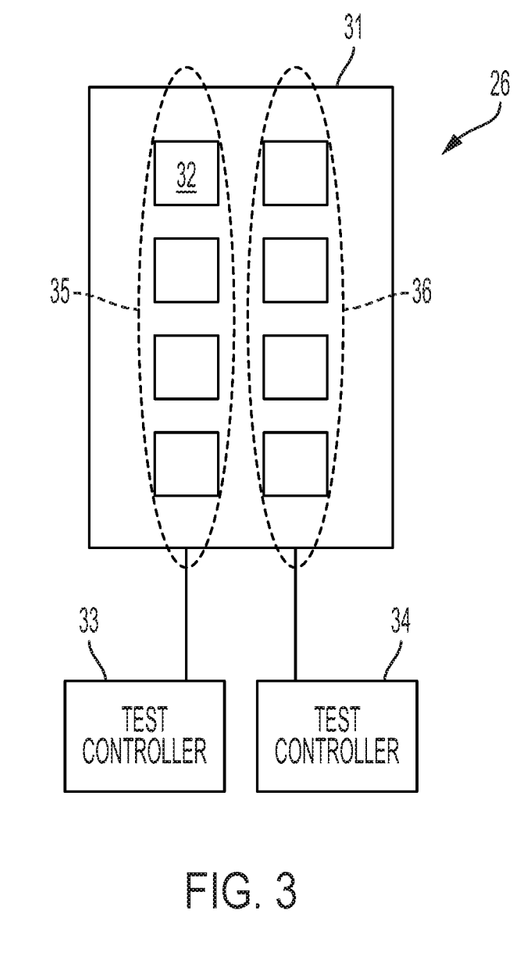
FIG. 3 is a block diagram of multiple test controller architecture for the test system.

FIGS. 2 and 3 represent, respectively, a single controller test architecture 25 and a multiple controller test architecture 26. FIG. 2 shows a DIB 27 containing eight test sites 28. In this example, test controller 29 is a processing device, such as a microprocessor. Test controller 29 may be part of a test instrument such as 13A to 13N and is used to control testing over all eight test sites 27 and, thus, over DUTs in those test sites.

Control over all eight test sites is represented by dashed ellipse 30.

FIG. 3 shows a DIB 31 containing eight test sites 32. In this example, there are multiple test controllers 33, 34—each for controlling four test sites on the DIB. In this example, each test controller is a processing device, such as a microprocessor. Each test controller may be part of a separate test instrument and is used to control testing over four test sites and, thus, over DUTs in those test sites. Each test controller may contain or control digital resources, analog resources, or both digital and analog resources to test a DUT in a test site. Control over four test sites by controller 33 is represented by dashed ellipse 35. Control over four test sites by controller 34 is represented by dashed ellipse 36.

Figure 4:
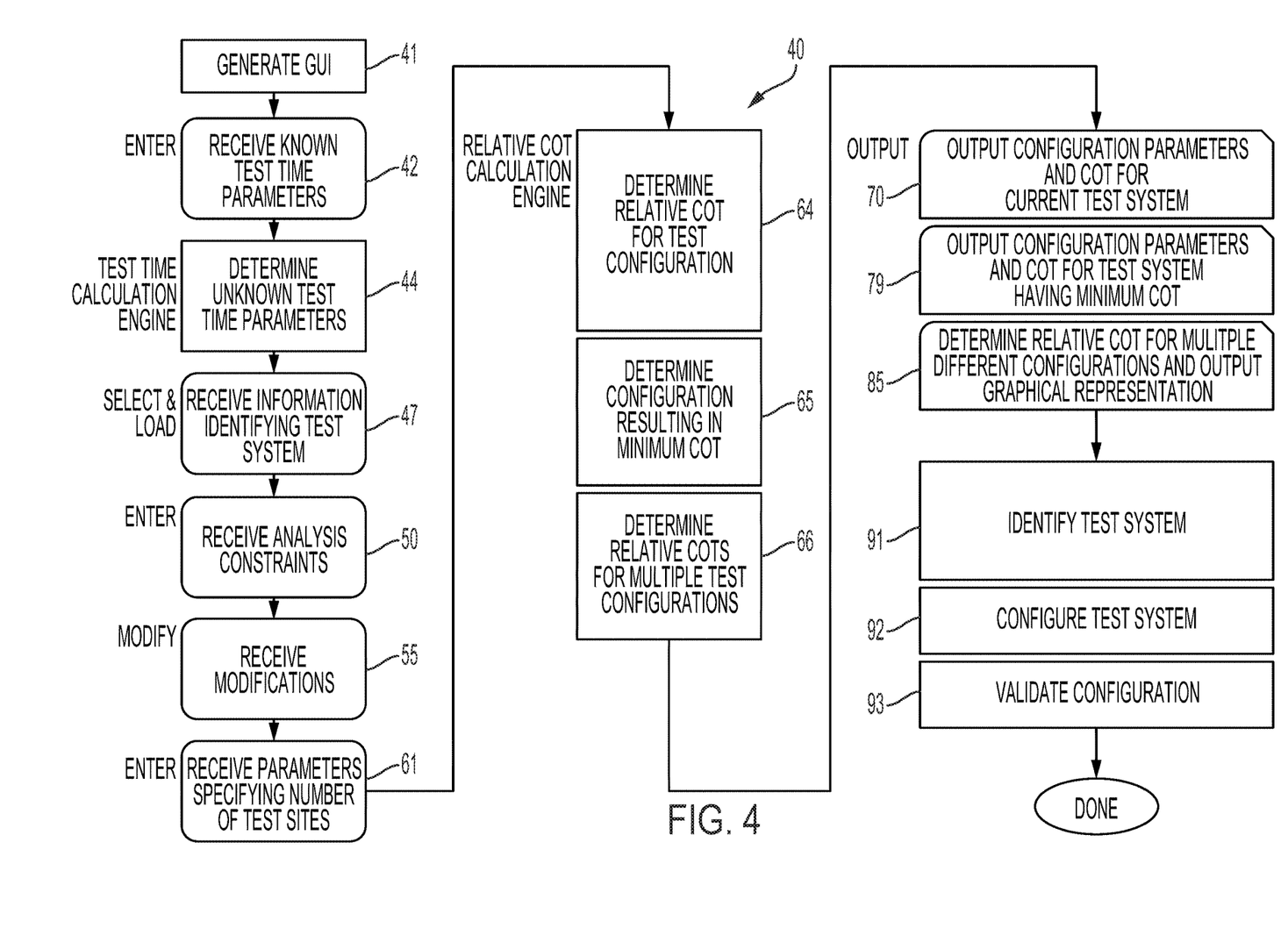
FIG. 4 is a flowchart containing example operations for determining and displaying a configuration and an optimized cost of test of a test system.

The example process described herein may configure features of a test system such as ATE 10 to optimize—for example, to minimize—a COT for one or more DUTs using that test system. An example process 40 for optimizing a COT is shown in FIG. 4. The following variables are used in a description of the process.

In an example, "SSTT", or single test time, is the test time required to test a single DUT. The SSTT may be measured in seconds ("s" or "sec"). In an example, "TEST SITES" defines the total number of DUTs being tested in parallel. Parallel testing may include testing that is simultaneous, concurrent, or contemporaneous. In an example, "MSTT", or single multi-site test time, is the total test time required to test all DUTs in parallel for a test insertion. The MSTT may be expressed in seconds. In an example, "PTE", or parallel test efficiency, is a measure of efficiency when testing multiple DUTs in parallel during a single test sequence compared to the amount of time required to test a single DUT. The PTE may be expressed in terms of percentage (%).

In an example, the "Relative COT" is a COT value that is determined by dividing the total test system cost by the number of second in a year and multiplying the resulting dividend by the test time per DUT ("TEST TIME"). The test system cost or "system cost" is the actual cost—for example, in US dollars or other currency—of the test system. The Relative COT may be expressed in cost/time, e.g., US dollars/second, or shorthanded to exclude the time component. The "TEST TIME" variable is the total time to test a single DUT. TEST TIME is also expressed as "Seconds/Device" and is based on the MSTT and the TEST SITES variables as shown in EQUATIONS 1 below.

COT may be determined for a test architecture that includes a single test controller, as in the example of FIG. 2. In this example, the relative COT is determined using "EQUATIONS 1" as follows:

$$\text{PTE} = 1 - (\text{MSTT} - \text{SSTT})/(\text{SSTT} * (\text{TEST SITES} - 1))$$

$$\text{MSTT} = ((1 - \text{PTE}) * (\text{SSTT} * (\text{TEST SITES} - 1))) + \text{SSTT}$$

$$\text{SSTT} = \text{MSTT}/(((1 - \text{PTE}) * (\text{TEST SITES} - 1)) + 1)$$

$$\text{TEST SITES} = (((\text{MSTT}/\text{SSTT}) - 1)/(1 - \text{PTE})) + 1$$

$$\text{TEST TIME} = \text{MSTT}/\text{TEST SITES}$$

$$\text{Relative COT} = (\text{Total System Cost/Second in One Year}) * \text{TEST TIME} \quad \text{EQUATIONS 1}$$

For a test system that includes multiple test controllers, such as the system of FIG. 3, "CNTRLS" is the number of test controllers in a system configuration. In some implementations, a test system includes one or more test controllers responsible for running a test program. Some test system architectures have multiple test controllers in which each test controller runs a test program on a subset of test sites. The test controllers may be part of the test instruments, as noted. In some implementations, there may be one test controller per test instrument. In some implementations, there may be more than one test controller per test instrument. CNTRLS may be expressed as an integer value. In an example, "CntrlPTE" is the test controller parallel test efficiency. CntrlPTE is a measure of efficiency when operating multiple test controllers at the same time (e.g., simultaneously, concurrently, or contemporaneously). CntrlPTE is expressed as a percentage (%).

In an example, "TEST SITES$_{cntrl}$" defines the total number of DUTs being tested in parallel using one test controller in a multiple controller architecture. In an example, "PTE$_{cntrl}$", or parallel test efficiency, is a measure of efficiency when testing multiple DUTs in parallel during a single test sequence compared to the amount of time required to test a single DUT. For the total test sites assigned to one test controller, this is the PTE for those test sites tested using that test controller. In an example, "PTE$_{compound}$" is the overall parallel test efficiency of a test system configuration when using a multiple test controller architecture. PTE$_{compound}$ may be expressed in terms of percentage (%). PTE$_{acrosscntrl}$ is a measure of parallel test efficiency when operating multiple test controllers at the same time (e.g., simultaneously, concurrently, or contemporaneously). In some implementations, this value is greater than 99%.

In an example, "MSTT$_{cntrl}$" is the multi-site test time within a test controller. For the total test sites assigned to one test controller in a multi-controller system, this is the total test time for those test sites using that test controller. This is a parameter used for determining the compound PTE (PTE$_{compound}$). MSTT$_{cntrl}$ may be expressed in seconds. In an example, "MSTT$_{total}$" is the test time for all test sites using all test controllers. This is the total test time during which all test sites operate with all test controllers. MSTT$_{total}$ may be expressed in seconds. In an example, "SSTT$_{cntrl}$" is the single site test time for testing one DUT in one test site. SSTT$_{cntrl}$ may be expressed in seconds.

COT may be determined for a test architecture that includes multiple test controllers, as in the example of FIG. 3. In this example, the relative COT is determined using "EQUATIONS 2" as follows:

$$\text{TEST SITES}_{total} = \text{total number of test sites in the test system}$$

$$\text{TEST SITES}_{cntrl} = \text{TEST SITES}/\text{CNTRLS}$$

$$\text{MSTT}_{cntrl} = ((1 - \text{PTE}_{cntrl}) * (\text{SSTT}_{cntrl} * (\text{TEST SITES}_{cntrl} - 1))) + \text{SSTT}_{cntrl}$$

$$\text{SSTT} = \text{MSTT}_{cntrl}$$

$$\text{MSST}_{total} = ((1 - \text{PTE}_{cntrl}) * (\text{SSTT} * (\text{CNTRLS} - 1))) + \text{SSTT}$$

$$\text{PTE}_{compound} = 1 - (\text{MSTT}_{total} - \text{SSTT}_{cntrl})/(\text{SSTT}_{cntrl} * (\text{TEST SITES}_{total} - 1))$$

$$\text{TEST TIME} = \text{MSTT}_{total}/\text{SITES}$$

$$\text{Relative COT} = \text{System Cost/Second} * \text{TEST TIME} \quad \text{EQUATIONS 2}$$

Analysis constraints are parameters that restrict how a test system can be configured in a minimum COT analysis. Example analysis constraints for the process include site count, site count resolution, and maximum number of test controllers. For example, the process for determining the COT can be limited to a maximum number of test sites to analyze. For example a "site count" value of 32 instructs the process to evaluate test sites of a test system that are numbered from 1 to 32. The process may be limited to a particular site count resolution. For example, the process may be limited to analyzing 128 test sites at a four test-site resolution. This constraint would limit the process to analyzing 128 test sites in four-site increments. In an example, "maximum number of test controllers" is the maximum number of test controllers that a test system can support. Some example test systems may be configured to support one test controller, four test controllers, or eight test controllers, for instance.

In an example, analysis constraints for the process also include the following. "Test instrument" is the name of the test instrument available for including in a test system configuration. Another example test constraint parameter is "test slot head type". In this regard, test systems may have different types of slots for different types of instruments. The "test slot head type" parameter defines the number of slots for a particular type of instrument that are available on a test system. The purpose of this parameter is that, as the test site count is increased during processing, there may be a point where there are no more slots available for a particular type of test instrument. This situation would limit the possible test configurations. Another example parameter is "test controllers per test instrument". In this regard, system architectures may allow multiple test controllers on a single test instrument board. This parameter defines the total number of test controllers each test instrument can include. This parameter may be used for multiple controller test system architecture configurations. Another example parameter is "test sites per test instrument". This parameter is based on a device to be tested. If the DUT has 64 digital pins and the test instrument supports 256 digital pins, then the instrument will support a maximum of four device test sites. Another example parameter is "price". This parameter represents the price of individual configurable test instruments. This parameter is used to determine the total configured price of the test system and is used in relative COT determinations.

FIG. 4 is a flowchart showing a process 40 containing example operations for determining a configuration of a test system and a COT associated with that configuration. Process 40 includes generating (41) a graphical user interface (GUI). The GUI includes fields for entering parameters relating to test time, parameters defining the test system configuration, and parameters defining analysis constraints. The GUI may also include fields for displaying a COT and parameters for an optimized tester configuration.

Figure 5:
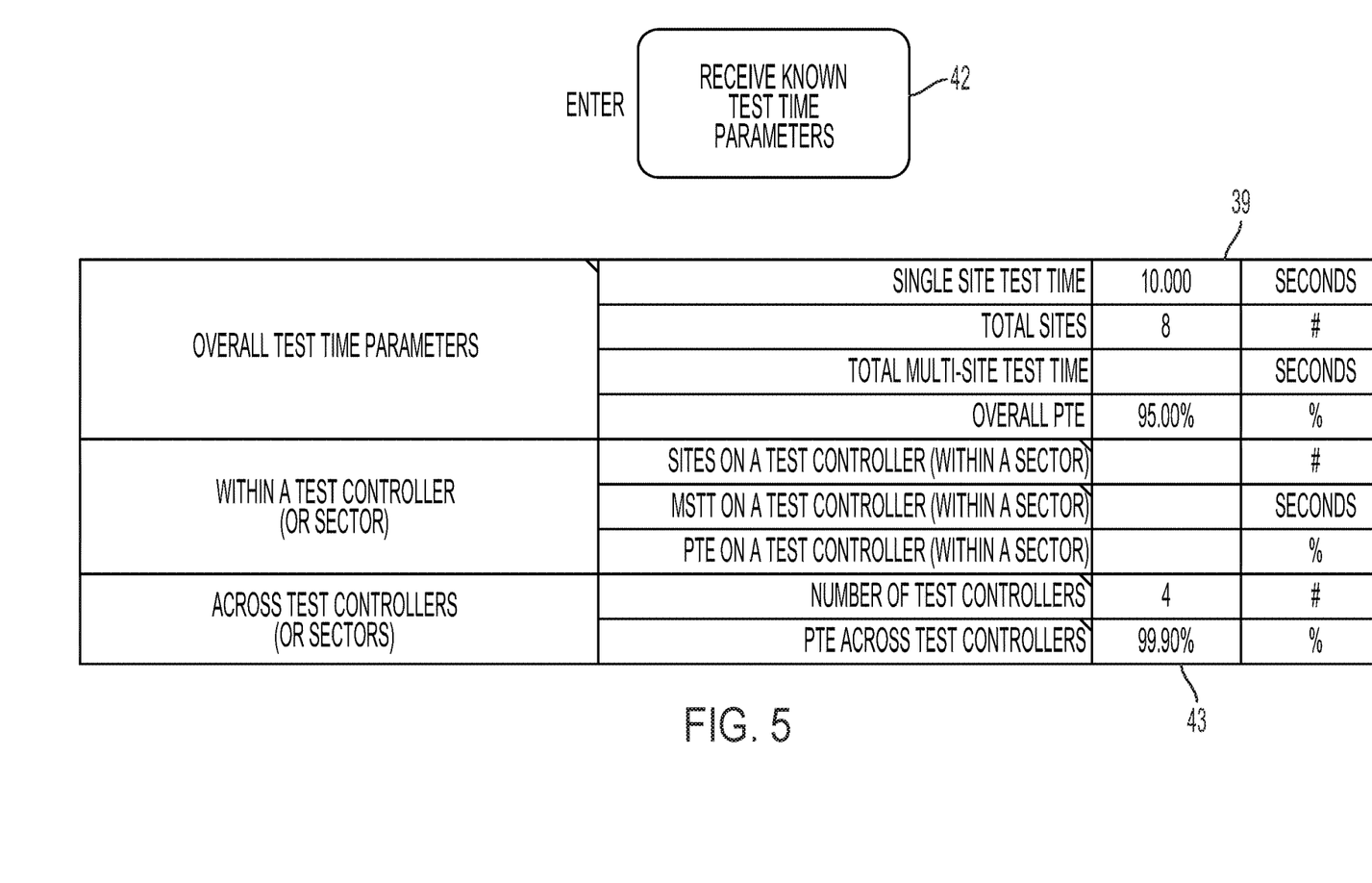
FIGS. 5, 6, 7, 8, and 9 show components of a graphical user interface for displaying parameters for, and an optimized cost of test of, a test system.

Referring also to FIG. 5, process 40 includes receiving (42) known test time parameters entered into fields of column 43 of GUI component 39. In this regard, GUI component 39 may be part of a single GUI that includes the GUI components shown in FIGS. 5 to 9. Examples of known test time parameters may include SSTT, SITES, MSTT, PTE, $SITES_{cntrl}$, $MSTT_{cntrl}$, $PTE_{cntrl}$, CNTRLS, and $PTE_{acrosscntrl}$. In some implementations, all or some test time parameters may be known beforehand. Those that are known may be entered and those that are unknown may be determined based on those that are known. Known test time parameters may be entered by a test engineer into a computing system that displays the GUI.

Figure 6:
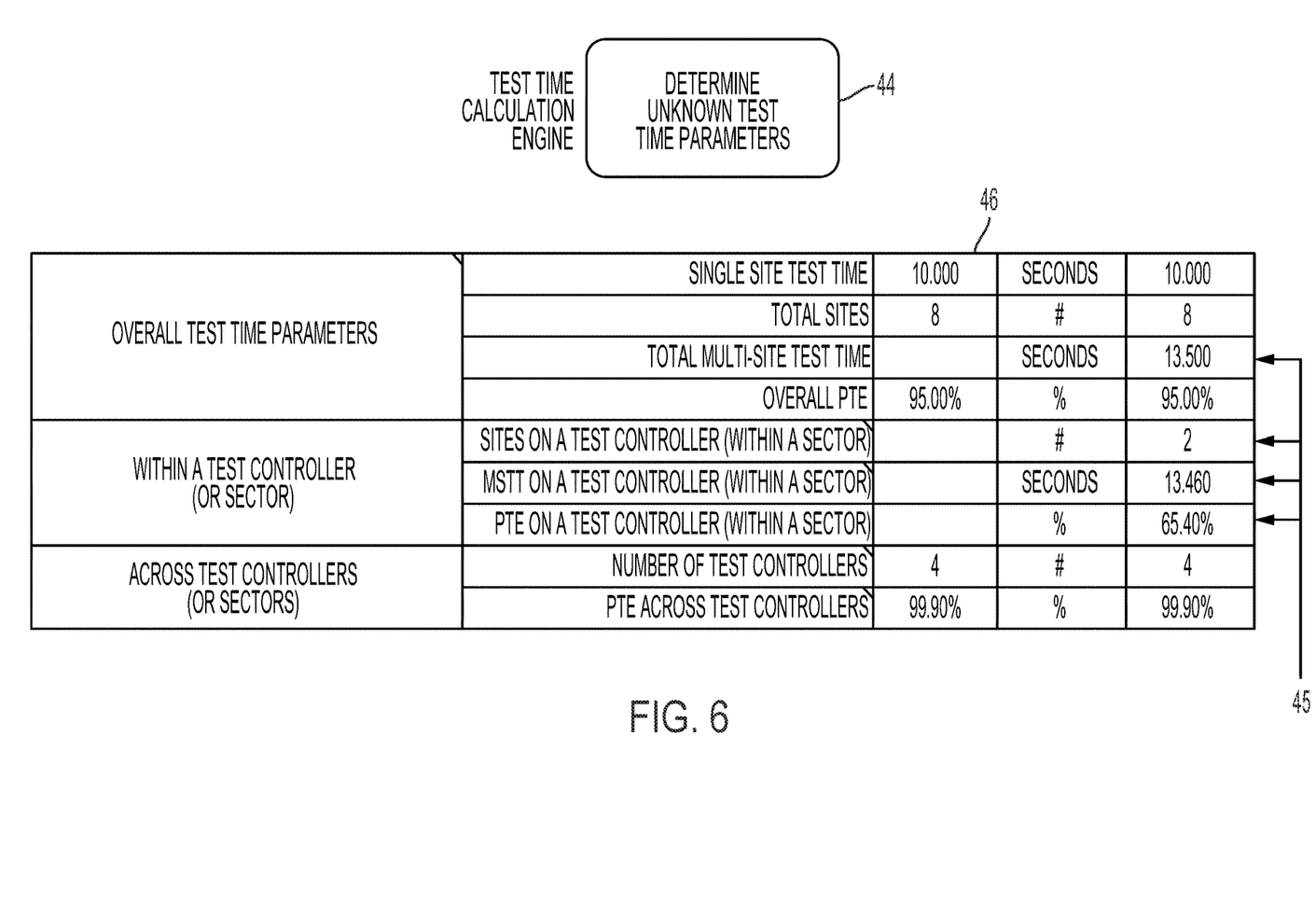

Referring also to FIG. 6, process 40 includes determining (44) unknown test time parameters for single test controller and multiple test controller systems. Operations performed to determine the unknown test time parameters may be performed by a test time calculation engine. The test time calculation engine may be implemented using executable instructions that determine the unknown test time parameters and that populate fields 45 of GUI component 46 with determined values of those test time parameters. The operations may determine the unknown test time parameters using the following equations for a single test controller test system.

SSTT=MSTT/(((1−PTE)*(TEST SITES−1))+1)

TEST SITES=(((MSTT/SSTT)−1)/(1−PTE))+1

MSTT=((1−PTE)*(SSTT*(TEST SITES−1)))+SSTT

PTE=1−(MSTT−SSTT)/(SSTT*(TEST SITES−1))

The operations may determine unknown test time parameters using the following equations for a multiple test controller test system.

TEST $SITES_{cntrl}$=TEST SITES/CNTRLS $MSTT_{cntrl}$=((1−$PTE_{cntrl}$)*(SSTT*(TEST $SITES_{cntrl}$−1)))+SSTT PTE=1−($MSTT_{cntrl}$−SSTT)/(SSTT*(TEST $SITES_{cntrl}$−1))

$MSTT_{total}$=((1−$PTE_{cntrl}$)*($MSTT_{cntrl}$*(CNTRLS−1)))+$MSTT_{cntrl}$

MSTT=$MSTT_{total}$

The test time calculation engine populates fields 45 of GUI component 46 with values for the unknown test parameters that were determined based on the known test parameters.

Figure 7:
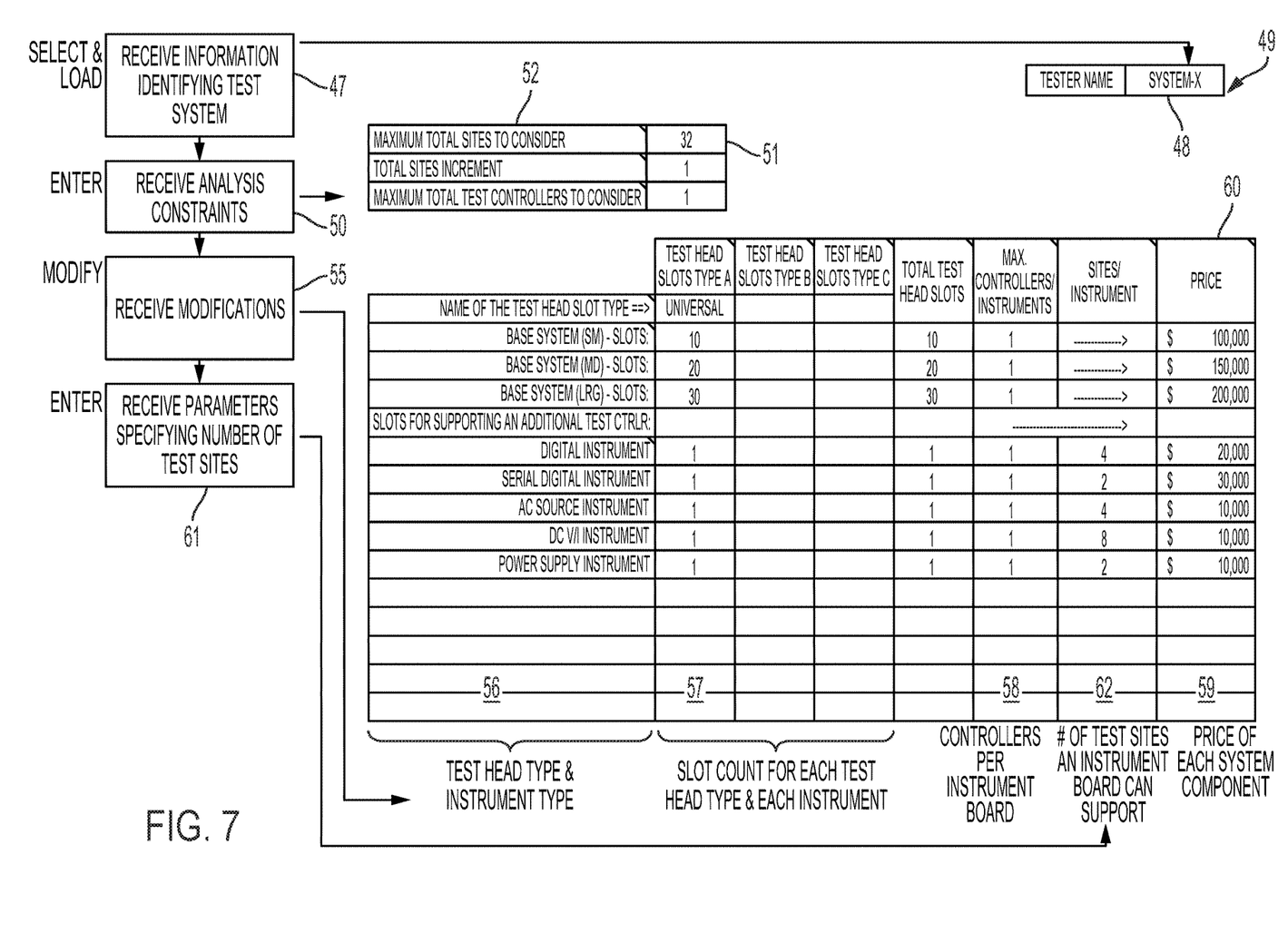

Referring also to FIG. 7, process 40 includes receiving (47), within field 48 of GUI component 49, information identifying a test system to analyze. The identity of the test system to analyze ("System-X") may be entered or selected using a drop-down menu. The test system to be analyzed is associated with configuration data, some of which may be used to populate corresponding fields of the GUI. The configuration data specifies a configuration of the test system, including whether the test system uses a single test controller or multiple test controllers. In some implementations, the configuration data may specify the number and types of test instruments in the test system. For example, the configuration data may specify the number of digital test instruments in the test system, the number of serial digital test instruments in the test system, the number of alternating current (AC) source test instruments in the test system, the number of direct current (DC) voltage/current (V/I) test instruments in the test system, and the number of power supply test instruments in the test system.

Process 40 includes receiving (50) analysis constraints into fields of column 51 of GUI 52. The analysis constraints may be entered or selected using a drop-down menu for each field. Examples of analysis constraints are provided above and include a maximum number of test sites for the test system, the total test site increment (test site resolution), and a maximum number of test controllers for the test system.

Process 40 includes receiving (55) modifications to entries in fields of columns 56, 57, 58, and 59 of GUI component 60. For example, parameters populated automatically based on the test configuration data loaded when the test system is selected may be modified. In this example, parameters that may be modified include the test head and test instrument type, the slot count for each test head and test instrument type, the number of test controllers per test instrument (also referred to as "test instrument board"), and the price of each component of the test system.

Process 40 includes receiving (61), into fields of column 62 of GUI component 60, parameters specifying the number of test sites that each test instrument supports. The number of test sites may be entered or selected using a drop-down menu for each field.

Operations 64, 65, and 66 of FIG. 4 may be performed using EQUATIONS 1 for a single test controller test systems and EQUATIONS 2 for multiple test controller test systems. Operations 64, 65, and 66 may be performed by a relative COT calculation engine. The relative COT calculation engine may include executable instructions to perform calculations using EQUATIONS 1 and EQUATIONS 2, including performing iterative calculations for different test system configurations. In this example, process 40 includes determining (64) the relative COT for a test system configuration having a specified number of test sites, a specified configuration of test instruments, a specified cost of the configuration, and a specified number of test slots. In this example, process 40 includes determining (65) a configuration of the test system that results in a minimum COT. For example, process 40 determines the number of test sites, the configuration of test instruments, the number of test slots, and the number of test controllers that together produce a minimum COT. In this example, process 40 includes determining (66) the relative COT for all potential (e.g., configurable) numbers of test sites in the test system and for all potential (e.g., configurable) numbers of test controllers in the test system.

Figure 8:
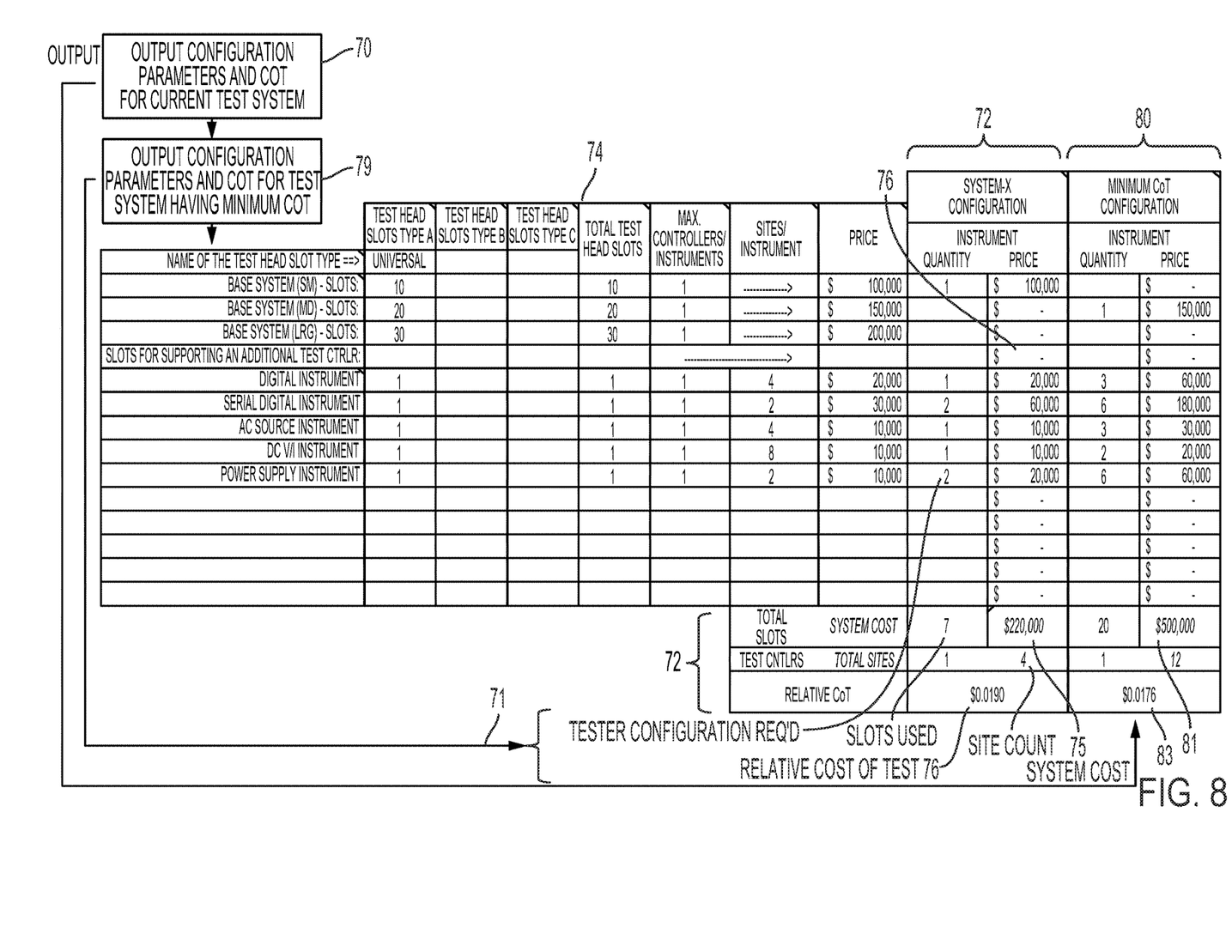

Referring also to FIG. 8, process 40 includes outputting (70), for display on the GUI, parameters for the configuration of the current test system and the COT of the current test system. For example, the parameters for the current test system configuration 71 may be displayed in parts 72 of GUI component 74. The current test system configuration may include the number and types of digital test instrument in the test system, the number of slots in the test system, and the number of test sites used for testing on the DIB. The COT of the current test system is also displayed. Field 75 includes the cost of the configuration of the test system. This cost is a sum of the costs incurred from the various components in column 76. Field 76 includes the relative COT, which is determined from EQUATIONS 1 or EQUATIONS 2 above.

Process 40 includes outputting (79), for display on the GUI, configuration parameters of the test system determined to have the minimum COT. The minimum COT is typically less than the COT of the current (or initial) test system configuration. The configuration of the test system having the minimum COT obeys whatever constraints are input into the system. In this example, parameters for the test system configuration may be displayed in columns 80. For example, the test system configuration having the minimum COT may include the number and types of digital test instruments in the test system, the number of slots in the test system used, and the number of test sites used for testing on the DIB. The minimum COT is also displayed in columns 80. Field 81 includes the cost of the configuration of the test system having the minimum COT. Field 83 includes the minimum relative COT, which is determined from EQUATIONS 1 or EQUATIONS 2 above.

Process 40 includes determining (85) the relative COT for multiple different configurations of the test system—for example, for test system configurations having different numbers of test sites or controllers. Determining (85) may be part of the operations performed to determine the configuration of the test system having the minimum COT. For example, in order to determine a configuration having a minimum COT, process 40 iterates over various different configurations of the test system. Process 40 saves these configurations in computer memory and uses the data for these configurations to compare the different configurations graphically.

Figure 9:
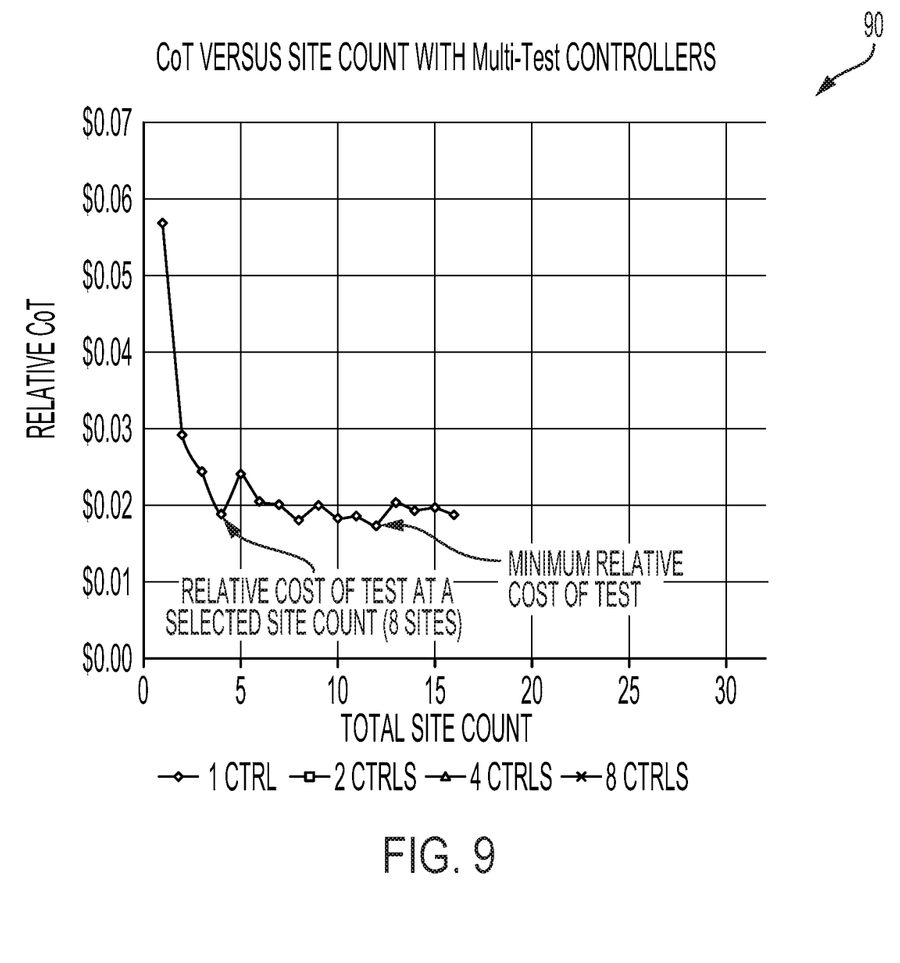

Process 40 outputs (85), for display on the GUI, a graphical representation of the relative COT of different configurations of the test system. In the example of FIG. 9, graphical representation 90 plots the change in relative COT for different numbers of numbers of test sites in the test system, assuming all remaining configuration parameters are the same. The plot shows the minimum relative COT, which occurs at about 12 test sites in this example. In some implementations, differently colored plots may be included in the graphical representation, with each differently colored plot being for a test system having a different number of test controllers.

Configurations determined by process 40 are limited by the hardware capability of the test system. In an example, process 40 determines a test system configuration that produced a lowest COT. Process 40 may identify a test system having the hardware capability to support this configuration. Process 40 may then control a tester network server to configure the test system into that configuration.

The tester network server may be or include a computing system of the type described herein. The tester network server may be connected to communicate with process 40 and with the various test instruments contained in the test system. Process 40 may instruct the tester network server to include certain test instruments, to exclude certain test instruments, to set the number of each included type of test instrument, and to vary operational parameters of the included test instruments. For example, process 40 may instruct the tester network server to include zero, one or more digital test instruments in the test system; zero, one or more serial digital test instruments in the test system; zero, one or more AC source test instruments in the test system; zero, one or more DC V/I test instruments in the test system; and/or zero, one or more power supply test instruments in the test system. For all or some of the test instruments included in the system, process 40 may instruct the tester network server to change one or more operational parameters. For example, process 40 may instruct the tester network server to set the voltage and current outputs of a DC V/I test instrument or to set the output power level of a power supply test instrument. Process 40 may send one or more notifications specifying the test system configuration to a production floor supervisor specifying which test system to use for testing.

In FIG. 4, process 40 includes identifying (91) a test system having components that can be configured into the configuration determined to have the minimum COT. Process 40 includes configuring (92) the test system so that it has the minimum COT. Configuring the test system may include controlling assembly of hardware components, such as test instruments, of the test system. In some examples, assembly may include connecting test instruments together to build the test system or disconnecting test instruments from an existing test system. Configuring the test system may include controlling robotics to assemble the test system using appropriate hardware components. For example, robotics may be used to move test instruments across a test floor to insert the test instruments into slots of a test system.

In some implementations, process 40 may configure the test system automatically. Automatic in this example includes operations performed absent user intervention unless an error occurs. In some implementations, process 40 may configure the test system based on input from a test engineer. For example, a test engineer may review the configuration determined by process 40 and instruct process 40 to produce the test system. In some implementations, process 40 may receive inputs during the configuring process to guide assembly of hardware components.

The configuration of the test system may be validated (93). For example, process 40 may confirm that the configuration is appropriate for the test system given any constraints associated with the test system.

The example process described herein may be implemented by, and/or controlled using, one or more computer systems comprising hardware or a combination of hardware and software. For example, a system like the ones described herein may include various test controllers and/or processing devices located at various points in the system to control operation of the automated elements. A central computer may coordinate operation among the various test controllers or processing devices. The central computer, test controllers, and processing devices may execute various software routines to effect control and coordination of the various automated elements.

The example process described herein can be implemented and/or controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one test site or distributed across multiple test sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Each computing device may include a hard drive for storing data and computer programs, and a processing device (e.g., a microprocessor) and memory (e.g., RAM) for executing computer programs. Each computing device may include an image capture device, such as a still camera or video camera. The image capture device may be built-in or simply accessible to the computing device and may be used to capture images of, and to control operations of, robotics to configure a test system.

Each computing device may include a graphics system, including a display screen. A display screen, such as an LCD or a CRT (Cathode Ray Tube) displays, to a user, images that are generated by the graphics system of the computing device. As is well known, display on a computer display (e.g., a monitor) physically transforms the computer display. For example, if the computer display is LCD-based, the orientation of liquid crystals can be changed by the application of biasing voltages in a physical transformation that is visually apparent to the user. As another example, if the computer display is a CRT, the state of a fluorescent screen can be changed by the impact of electrons in a physical transformation that is also visually apparent. Each display screen may be touch-sensitive, allowing a user to enter information onto the display screen via a virtual keyboard. On some computing devices, such as a desktop or smartphone, a physical QWERTY keyboard and scroll wheel may be provided for entering information onto the display screen. Each computing device, and computer programs executed thereon, may also be configured to accept voice commands, and to perform functions in response to such commands. For example, the example processes described herein may be initiated at a client, to the extent possible, via voice commands.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A method performed by one or more processing devices, comprising:

obtaining first parameters relating to at least part of an operation of a test system, the first parameters relating to hardware components of the test system, the hardware components comprising a number of controllers to be included in the test system and a number of test sites to be included in the system, where each controller is configured to control testing in one or more of the test sites;

obtaining second parameters specifying at least part of a first configuration of the test system, the first configuration comprising a first assembly of hardware components;

determining a second configuration of the test system based, at least in part, on the first parameters and the second parameters, the second configuration comprising a second assembly of hardware components that is different from the first assembly of hardware components, wherein determining the second configuration comprises iterating through different configurations of the test system including different numbers of controllers and test sites tested by each of the controllers, and where the second configuration is determined to impact a cost of test of the test system;

generating, by one or more processing devices, data for a graphical user interface representing information about the second configuration and the cost of test, the information comprising one or more plots showing a change in cost of test based on at least the first configuration and the second configuration; and outputting the data for the graphical user interface for rendering on a display device.

2. The method of claim 1, further comprising:
configuring the test system automatically based on the second configuration.

3. The method of claim 2, wherein configuring the test system comprises controlling assembly of hardware components of the test system.

4. The method of claim 3, wherein controlling assembly comprises controlling robotics to assemble the test system using the hardware components.

5. The method of claim 2, wherein configuring the test system comprises specifying a number of test slots and a number of test boards to incorporate into the test system to perform testing.

6. The method of claim 2, wherein configuring the test system comprises specifying a number of controllers to include in the test system.

7. The method of claim 1, wherein the first parameters comprise one of more of the following: single test time, parallel test site efficiency, test controller efficiency, or multi-test time.

8. The method of claim 1, wherein the second parameters comprise one or more of the following: types of test head slots, test instrument assignments for test head slot types, or test controllers per test instrument, or test system component costs.

9. The method of claim 1, wherein the test system is for testing a device;
wherein the method further comprises receiving third parameters based on the device to be tested; and
wherein the second configuration is determined based also on the third parameters.

10. The method of claim 9, wherein the first parameters comprise a test time;
wherein the second parameters comprise at least one of a number of test slots, a number of test boards, or a number of controllers; and
wherein the cost of test comprises a minimized cost of test corresponding to the second configuration.

11. The method of claim 1, wherein the second configuration is determined to minimize a cost of test of the test system.

12. The method of claim 1, wherein the at least part of the first configuration is based on operational parameters of one or more test instruments in the test system that are used to test one or more devices.

13. The method of claim 1, wherein the second configuration is determined to optimize a cost of test of the test system;
wherein the method further comprises determining an initial cost of test for the first configuration; and
wherein an optimized cost of test is less than the initial cost of test.

14. The method of claim 13, wherein the optimized cost of test is different from a minimized cost of test of the test system.

15. The method of claim 1, further comprising:
determining third parameters based on the second parameters, the third parameters specifying at least part of the second configuration;
wherein the second configuration is determined also based on the third parameters.

16. The method of claim 15, wherein the third parameters comprise information about the test system unknown from the second parameters.

17. The method of claim 1, further comprising:
determining third parameters based on the first parameters, the third parameters specifying at least part of the operation of the test system;
wherein the second configuration is determined also based on the third parameters.

18. The method of claim 17, wherein the third parameters comprise information about the test system unknown from the first parameters.

19. The method of claim 18, wherein the second configuration is determined to minimize a cost of test of the test system.

20. One or more non-transitory machine-readable storage devices storing instructions that are executable by one or more processing devices to perform operations comprising:
obtaining first parameters relating to at least part of an operation of a test system, the first parameters relating to hardware components of the test system, the hardware components comprising a number of controllers to be included in the test system and a number of test sites to be included in the system, where each controller is configured to control testing in one or more of the test sites;
obtaining second parameters specifying at least part of a first configuration of the test system, the first configuration comprising a first assembly of hardware components;
determining a second configuration of the test system based, at least in part, on the first parameters and the second parameters, the second configuration comprising a second assembly of hardware components that is different from the first assembly of hardware components, wherein determining the second configuration comprises iterating through different configurations of the test system including different numbers of controllers and test sites tested by each of the controllers, and where the second configuration is determined to impact a cost of test of the test system;
generating data for a graphical user interface representing information about the second configuration and the cost of test, the information comprising one or more plots showing a change in cost of test based on at least the first configuration and the second configuration; and
outputting the data for the graphical user interface for rendering on a display device.

21. The one or more non-transitory machine-readable storage devices of claim 20, further comprising:
configuring the test system automatically based on the second configuration.

22. The one or more non-transitory machine-readable storage devices of claim 21, wherein configuring the test system comprises controlling assembly of hardware components of the test system.

23. The one or more non-transitory machine-readable storage devices of claim 22, wherein controlling assembly comprises controlling robotics to assemble the test system using the hardware components.

24. The one or more non-transitory machine-readable storage devices of claim 21, wherein configuring the test system comprises specifying a number of test slots and a number of test boards to incorporate into the test system to perform testing.

25. The one or more non-transitory machine-readable storage devices of claim 21, wherein configuring the test system comprises specifying a number of controllers to include in the test system.

26. The one or more non-transitory machine-readable storage devices of claim 20, wherein the first parameters comprise one of more of the following: single test time, parallel test site efficiency, test controller efficiency, or multi-test time.

27. The one or more non-transitory machine-readable storage devices of claim 20, wherein the second parameters comprise one or more of the following: types of test head slots, test instrument assignments for test head slot types, or test controllers per test instrument, or test system component costs.

28. The one or more non-transitory machine-readable storage devices of claim 20, wherein the test system is for testing a device;
  wherein the operations comprise receiving third parameters based on the device to be tested; and
  wherein the second configuration is determined based also on the third parameters.

29. The one or more non-transitory machine-readable storage devices of claim 28, wherein the first parameters comprise a test time;
  wherein the second parameters comprise at least one of a number of test slots, a number of test boards, or a number of controllers; and
  wherein the cost of test comprises a minimized cost of test corresponding to the second configuration.

30. The one or more non-transitory machine-readable storage devices of claim 20, wherein the second configuration is determined to minimize a cost of test of the test system.

31. The one or more non-transitory machine-readable storage devices of claim 20, wherein the at least part of the first configuration is based on operational parameters of one or more test instruments in the test system that are used to test one or more devices.

32. The one or more non-transitory machine-readable storage devices of claim 31, wherein the second configuration is determined to optimize a cost of test of the test system;
  wherein the operations comprise determining an initial cost of test for the first configuration; and
  wherein an optimized cost of test is less than the initial cost of test.

33. The one or more non-transitory machine-readable storage devices of claim 32, wherein the optimized cost of test is different from a minimized cost of test of the test system.

34. The one or more non-transitory machine-readable storage devices of claim 30, wherein the operations comprise:
  determining third parameters based on the second parameters, the third parameters specifying at least part of the second configuration;
  wherein the second configuration is determined also based on the third parameters.

35. The one or more non-transitory machine-readable storage devices of claim 34, wherein the third parameters comprise information about the test system unknown from the second parameters.

36. The one or more non-transitory machine-readable storage devices of claim 20, wherein the operations comprise:
  determining third parameters based on the first parameters, the third parameters specifying at least part of the operation of the test system;
  wherein the second configuration is determined also based on the third parameters.

37. The one or more non-transitory machine-readable storage devices of claim 36, wherein the third parameters comprise information about the test system unknown from the first parameters.

38. The one or more non-transitory machine-readable storage devices of claim 37, the second configuration is determined to minimize a cost of test of the test system.

* * * * *